United States Patent [19]
Abe et al.

[11] Patent Number: 5,914,281
[45] Date of Patent: Jun. 22, 1999

[54] APPARATUS FOR ETCHING WAFER

[75] Inventors: Tatsuo Abe; Makoto Suzuki, both of Fukushima, Japan

[73] Assignee: Shin-Etsu Handotai Co., Ltd., Tokyo, Japan

[21] Appl. No.: 08/706,071

[22] Filed: Aug. 30, 1996

[30] Foreign Application Priority Data

Aug. 30, 1995 [JP] Japan .................................. 7-245402

[51] Int. Cl.$^6$ ................................................. H01L 21/306
[52] U.S. Cl. ........................... 438/747; 156/345; 216/90; 438/748; 438/753; 438/756
[58] Field of Search ........................... 156/345 L, 637.1, 156/640.1, 662.1; 216/90; 438/747, 748, 753, 756

[56] References Cited

U.S. PATENT DOCUMENTS

| | | | |
|---|---|---|---|
| 3,640,792 | 2/1972 | Alleman et al. | 156/345 |
| 3,677,848 | 7/1972 | Stoller et al. | 156/17 |
| 3,799,179 | 3/1974 | Thomas | 134/95 |
| 3,964,957 | 6/1976 | Walsh | 156/345 |
| 4,251,317 | 2/1981 | Foote | 156/639 |
| 4,817,652 | 4/1989 | Liu et al. | 134/102 |
| 4,840,701 | 6/1989 | Stern | 156/637 |
| 5,000,795 | 3/1991 | Chung et al. | 134/37 |
| 5,430,437 | 7/1995 | Ichikawa et al. | 340/825.44 |

*Primary Examiner*—Nam Nguyen
*Assistant Examiner*—Steven H. VerSteeg
*Attorney, Agent, or Firm*—Evenson, McKeown, Edwards & Lenahan, P.L.L.C.

[57] ABSTRACT

According to the invention, a plurality of wafers are disposed in a steady-state rotating flow of a mixed acid in a main chemical processing zone in an etching trough, the rotating flow being formed to be substantially concentric circle with the wafers, thus permitting uniform dispersion of air bubbles for bubbling in the mixed acid and stable flow thereof to obtain reliable reproduction of satisfactory flatness and luster. A flow of mixed acid in the etching trough is formed as a superficial horizontal laminar flow in the neighborhood of the liquid level and a rotating flow induced in the neighborhood of the semiconductor wafer. Mixed acid in the etching trough is caused to overflow from the mixed acid supply side to the opposite side and is thus discharged.

10 Claims, 3 Drawing Sheets

5,914,281

APPARATUS FOR ETCHING WAFER

BACKGROUND OF THE INVENTION

1. Field of the Invention

This invention relates to an etching apparatus for etching semiconductor wafers (hereinafter referred to as wafers) through wet chemical processing by exposing the wafers to a mixed acid with dispersed air bubbles for bubbling therein and, more particularly, to an etching apparatus of the above type, which is provided with a mixed acid supply method for permitting stable flatness and luster (brightness) of wafers to be obtained.

2. Description of the Prior Art

Semiconductor silicon wafers are manufactured by slicing a silicon single crystal ingot into the form of wafers, chamfering and rounding the edge of the sliced wafers, lapping the chamfered wafers to approximate a prescribed wafer thickness, etching away a roughness of the surface resulting from the lapping, and then mirror finishing a single-sided principal surface of the resultant wafers.

The etching step in the above manufacture has an aim of removing a roughness of the surface and/or surface strain layer, which are formed on the wafer surface by chamfering, lapping or like mechanical process, through dissolution in the mixed acid. For this step, an apparatus for chemically processing wafers has been desired, which can satisfy both flatness and luster.

As shown in the schematic sectional view of FIG. 5, a prior art etching apparatus comprises a mixed acid feeder 50, an etching trough 51, an overflow trough 52, and a bubbling pipe 14. Between the etching trough 51 and the mixed acid feeder 50, a rectifying plate 53 is provided. As shown in FIG. 6, the rectifying plate 53 has vertical breakthrough hole group 55 formed substantially its entire surface. Mixed acid 18 is supplied from the mixed acid feeder 50 through the rectifying plate 53 to the etching trough 51 to form a parallel laminar flow (i.e., a parallel laminar flow is constituted by a number of laminar flows in the form of slits which are parallel in the horizontal direction) 56. Air bubbles for bubbling 15 are dispersed uniformly in the parallel laminar flow through the bubbling pipe 14. In the chemical processing zone thus formed, wafers 21 are dipped such that they are parallel to the parallel laminar flow and spaced apart vertically at an adequate interval. For the chemical processing, the wafers 21 are rotated in the direction of arrow A. The mixed acid that has formed the parallel laminar flow, is allowed to overflow over a vertical wall 57, which faces the rectifying plate 53, into the overflow trough 52.

As an example of etching using the etching apparatus having the above structure, silicon wafers having a diameter of 150 mm were used by using a mixed acid containing 50% fluoric acid and equal volume ratios of concentrated nitric acid and concentrated acetic acid and setting the etching temperature to 30° C.

Silicon was dissolved in advance in a range of 10.0 to 13.0 g/l in the mixed acid. The mixed acid containing silicon dissolved in this way, was supplied at a rate of 250 l/minute by a pump P through the rectifying plate 53 in the mixed acid feeder 50 to the etching trough 51, while supplying air bubbles for bubbling at a rate of 200 l/minute from a compressor C through the bubbling pipe 14 which was disposed in a bottom portion of the etching trough 51. FIG. 7 shows the results of etching the silicon wafers in the above way.

By increasing the content of dissolved silicon in the mixed acid as an etching condition in steps each of 0.5 g from 10.0 g/l to 13.0 g/l, the etching rate was reduced from 1.13 µm/minute (with mixed acid containing 10.0 g/l of dissolved silicon) to 0.82 µm/minute (with mixed acid containing 13.0 g/l of dissolved silicon). The luster was reduced by 47% from 62% to 33%. This luster reduction is extreme, indicating that the luster is unstable.

The fact that the luster is extremely reduced and unstable is thought to be due to the following problems present in the chemical processing zone in the prior art etching apparatus, in which the wafers are dipped.

a) In the chemical processing zone, in which the mixed acid flows in a status as shown in FIG. 5, a portion of the mixed acid corresponding to an upper portion of the chemical processing zone is caused to flow out quickly from the etching trough 51 over to the overflow trough 53, and this flow has an effect of pressing and making stagnant the mixed acid in a lower part of the zone.

b) From this reason, air bubbles for bubbling 15 are not uniformly dispersed over the entire zone.

c) The flow of mixed acid in the locality where the wafers 21 are dipped is unstable, that is, the parallel laminar flow 56 strikes perpendicularly the vertical wall 57 facing the rectifying plate 53, thus disturbing the flow of the mixed acid.

d) A great stagnated region of mixed acid is present in correspondence to a lower portion of the vertical wall 57.

SUMMARY OF THE INVENTION

To solve the above problems inherent in the prior art, it is an object of the invention to provide a process of and an apparatus for etching wafers, in which a plurality of wafers are disposed in a steady-state rotating flow of a mixed acid in a main chemical processing zone in an etching trough, the rotating flow being formed to be substantially concentric circle with the wafers, thus permitting uniform dispersion of air bubbles for bubbling in the mixed acid and stable flow thereof to obtain reliable reproduction of satisfactory flatness and luster.

To attain the above object, according to the invention a process of etching wafers is provided, which comprises of disposing parallel to a flow of mixed acid a plurality of semiconductor wafers in an etching trough supplied with an etching mixed acid, spaced apart vertically at a suitable interval and capable of being rotated, and supplying the mixed acid to the etching trough, dispersing air bubbles for bubbling being supplied through a lower portion of the etching trough into the mixed acid therein for the chemical processing, the mixed acid being caused to flow through the etching trough as a superficial horizontal laminar flow formed in the neighborhood of the liquid level and a rotating flow induced in the neighborhood of the semiconductor wafers, the mixed acid in the etching trough being caused to overflow on the side thereof opposite its supply side and thus discharged.

Suitably, the rotating flow is induced in the neighborhood of the semiconductor wafers by rotating flow inducing means including a mixed acid feeder located adjacent to the etching trough and beneath the center position of the wafers accommodated in the etching trough and the superficial horizontal laminar flow in the neighborhood of the liquid level.

Suitably, the superficial horizontal laminar flow is formed in the neighborhood of the liquid level in the etching trough by superficial horizontal laminar flow generating means located adjacent to the etching trough and above the center position of the wafers accommodated in the etching trough.

Suitably, the overflow of the mixed acid is caused by an upwardly outwardly inclined plate.

Suitably, the rotating or superficial horizontal laminar flow is formed by rotating or superficial horizontal laminar flow generating means constituted by a laminar flow of mixed acid jet through round breakthrough holes or horizontal slit holes and the superficial horizontal laminar flow in the neighborhood of the liquid level.

The apparatus for etching wafer according to claim 7 in the invention is provided suitably for the above etching processing;

wherein comprises an etching mixed acid feeder, an etching trough, and an overflow trough, semiconductor wafers disposed in the etching trough such that they are substantially, spaced apart at a suitable interval, parallel to a mixed acid flow and capable of being rotated being chemically processed by causing air bubbles for bubbling to be dispersed in the mixed acid flow through a lower portion of the etching trough, the mixed acid being caused to flow through the etching trough as a superficial horizontal laminar flow formed in the surface of the liquid level and a rotating flow induced in the neighborhood of the semiconductor wafers.

Suitably, the etching apparatus further comprises a rectifying plate disposed between the etching trough and the mixed acid feeder, the rectifying plate having an upper portion formed with a plurality of mixed acid rectifying breakthrough holes for forming the superficial horizontal laminar flow and a lower portion formed with a mixed acid feeding breakthrough hole for inducing the rotating flow in the neighborhood of the semiconductor wafers.

Suitably, the etching apparatus further comprises an upwardly outwardly inclined plate disposed on the side of the wafer disposition position opposite the rectifying plate, thus permitting the rotating flow to be maintained by a cooperation of the superficial horizontal laminar flow and the inclined plate.

The mixed acid rectifying breakthrough holes have a shape of a round hole or a horizontal slit.

As shown, according to the invention a plurality of wafers are disposed in a steady-state rotating flow of a mixed acid in a main chemical processing zone in an etching trough, the rotating flow being formed to be substantially concentric circle with the wafers, thus permitting the setting of satisfactory etching conditions.

In addition, according to the invention with effective dispositions of the rectifying plate and the inclined plate it is possible to form a superficial horizontal laminar flow inducing the rotating flow and also prevent stagnation of mixed acid in the etching trough, thus permitting effective etching speed and luster to be attained without possibility of attachment of impurities or the like to the etched wafers in the rotating flow.

BRIEF DESCRIPTION OF THE DRAWINGS

FIG. 6 is a plan view, partly broken away, showing rectifying breakthrough holes formed in a rectifying plate shown in FIG. 5; and FIG. 7 is a graph showing results of etching done with the etching apparatus shown in FIG. 5.

Figure 1:
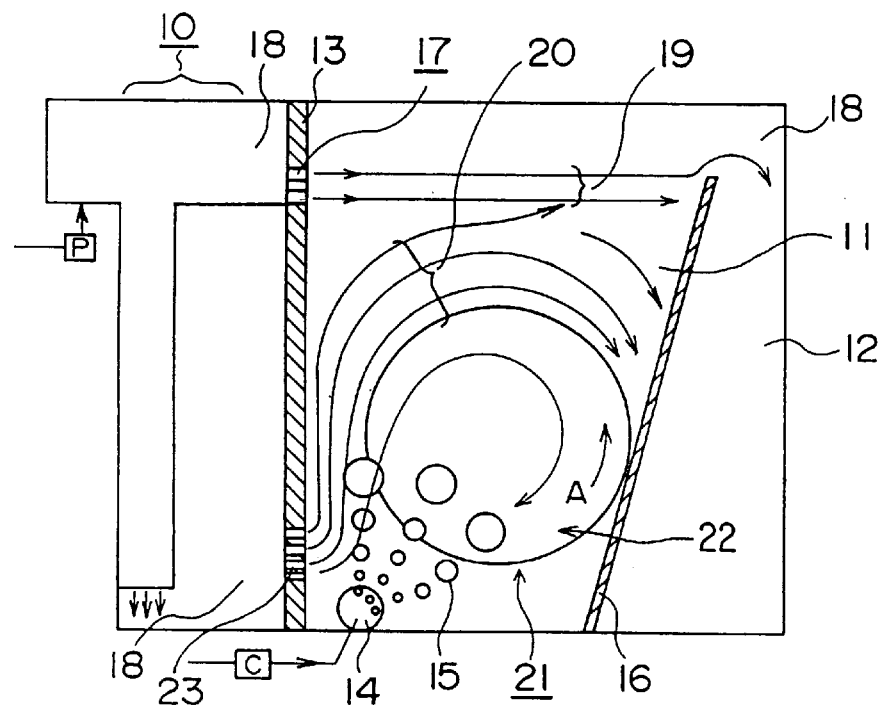
FIG. 1 is a schematic sectional view showing an etching apparatus according to the invention.
Figure 2:
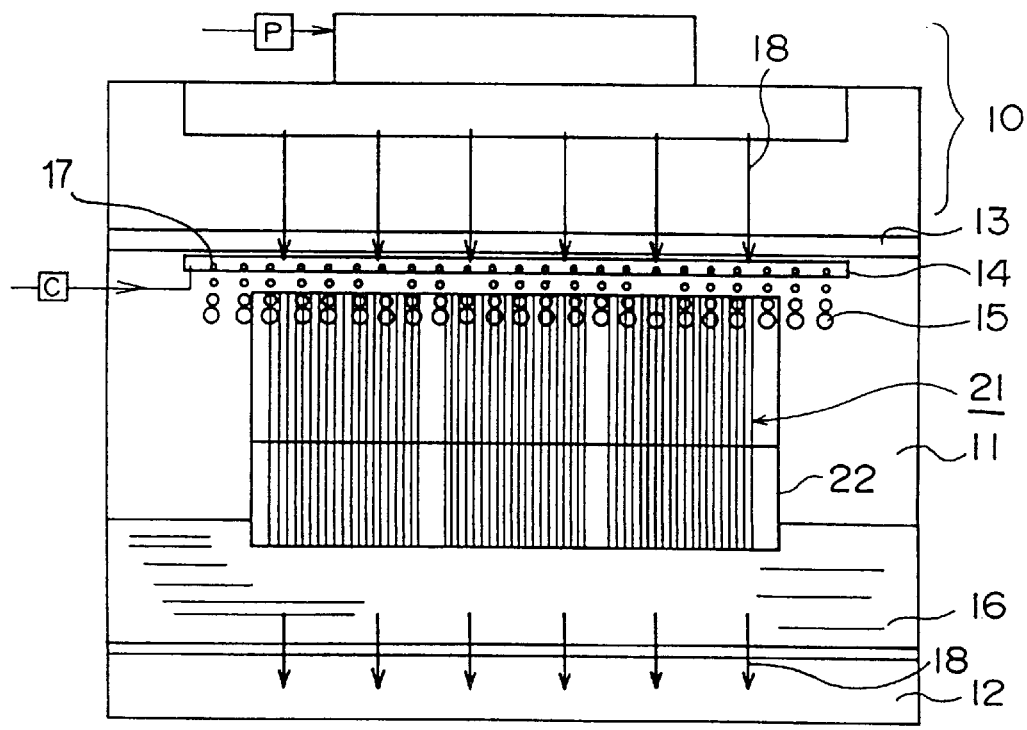
FIG. 2 is a plan view showing the apparatus shown in FIG. 1.

In the FIGS. 1 and 2, reference numeral 10 designates a mixed acid feeder, 11 an etching trough, 12 an overflow trough, 13 a rectifying plate, 14 a bubbling pipe, 15 air bubbles, 16 inclined plate, 17 mixed acid rectifying breakthrough holes, 18 mixed acid, 19 superficial horizontal laminar flow (not shown in FIG. 2), 20 rotating flow (not shown in FIG. 2), 21 group of wafers, 23 mixed acid supply breakthrough hole (not shown in FIG. 2).

DETAILED DESCRIPTION OF THE PREFERRED EMBODIMENT

A preferred embodiment of the invention will be described with reference to the drawings. Unless particularly specified, the sizes, shapes, relative dispositions, etc. of constituent parts described in connection with the embodiment have no sense of limiting the scope of the invention but are merely exemplary.

FIG. 1 is a schematic sectional view showing an etching apparatus according to the invention. FIG. 2 is a plan view showing the etching apparatus shown in FIG. 1.

The etching apparatus as shown according to the invention comprises a mixed acids feeder 10, an etching trough 11 and an overflow trough 12. A rectifying plate 13 partitioned the mixed acid feeder 10 and the etching trough 11 from each other. An inclined plate 16 partitions the etching trough 11 and the overflow trough 12 from each other. The inclined plate 16 is inclined upward toward the overflow trough 12, and it has such a height as to permit overflow of a superficial horizontal laminar flow in the etching trough 11 over it to the overflow trough 12.

Figure 3A:
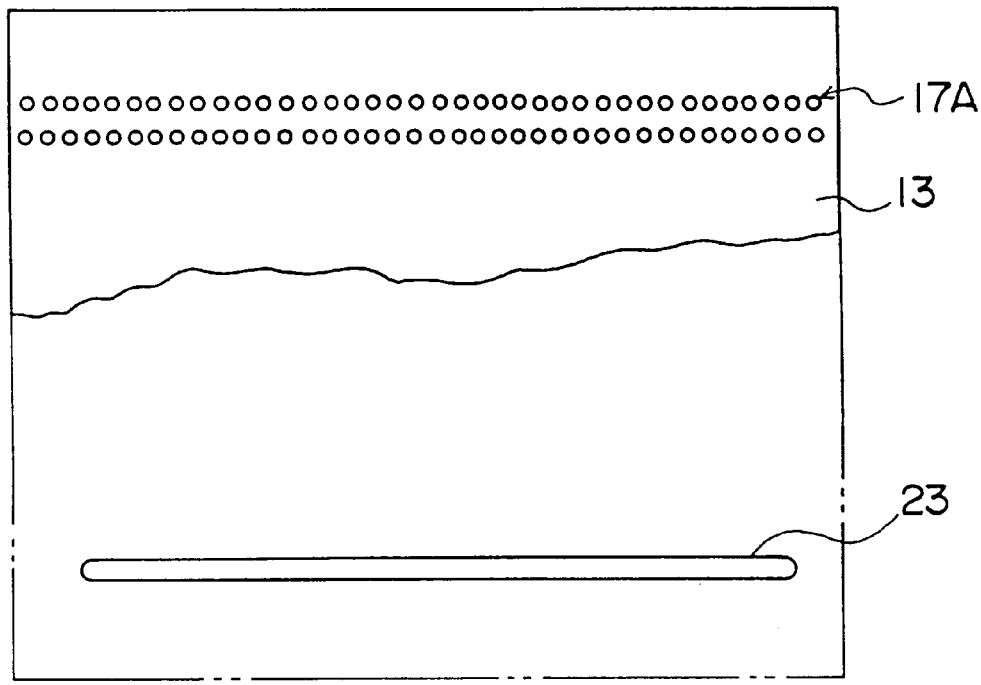
FIGS. 3(A) and 3(B) are plan views, partly broken away, showing examples of rectifying breakthrough holes formed in a rectifying plate shown in FIG. 1, FIG. 3(A) showing an example where the rectifying breakthrough holes are round breakthrough holes, FIG. 3(B) showing an example where the rectifying breakthrough holes are elongate through holes.
Figure 3B:
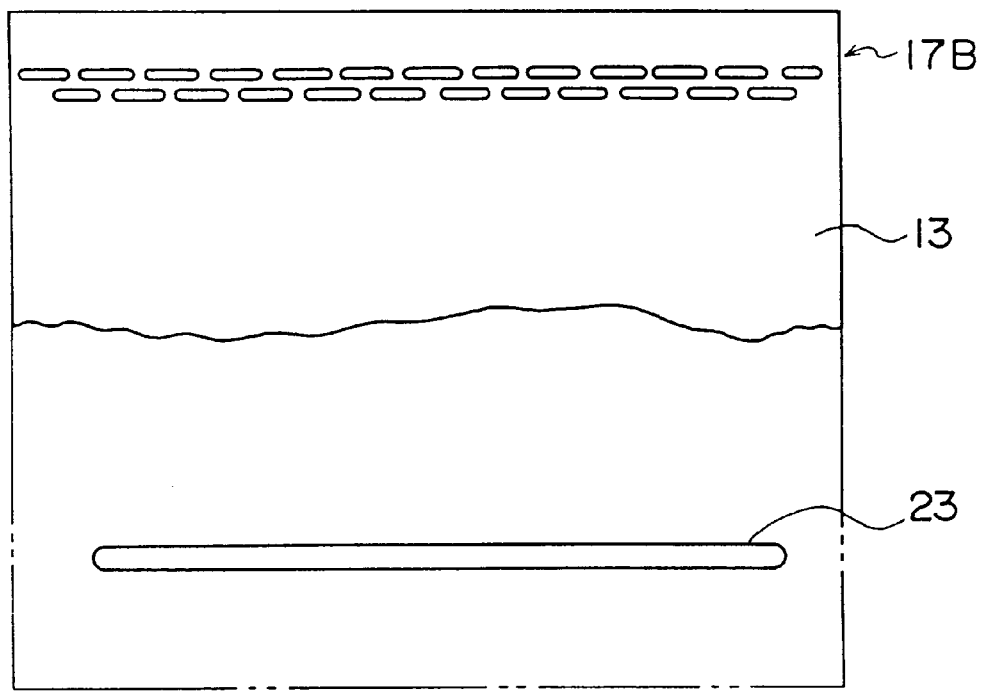

As shown in FIG. 3(A) or 3(B), an upper portion of the rectifying plate 13 has a plurality of mixed acid rectification breakthrough holes 17A or 17B, which are formed in horizontal rows at positions slightly below the upper end of the inclined plate 16 and slightly above the top of the wafers accommodated in the etching trough 11. A powerful superficial horizontal laminar flow 19 thus can be formed by mixed acid passing through the breakthrough holes 17A or 17B.

As shown in FIG. 3(A) or 3(B), a lower portion of the rectifying plate 13 has a mixed acid supply breakthrough hole 23, which is a horizontal slit formed at a position below the center position of the wafers accommodated in the etching trough 11. With this arrangement, a rotating flow 20 can be induced in the etching trough 11 in the neighborhood of the wafers 21 below the superficial horizontal laminar flow.

In the case of FIG. 3(A), the mixed acid rectification breakthrough holes 17A are round holes. In the case of FIG. 3(B), the mixed acid rectification breakthrough holes 17B are elongate holes. The lower mixed acid supply through hole 23 may have any shape, such as a horizontal slit as shown, extending in the width direction of the rectifying plate 13. Theoretically, it is possible to provide a slit like the slit 23 in place of the mixed acid rectification breakthrough holes 17A or 17B. Designated at 14 is a bubbling pipe, through which compressed air forced out from a compressor C is jet into the etching trough 11 to form air bubbles 15 in the mixed acid. Designated at P is a pump for supplying mixed acid, in silicon has been dissolved beforehand under a predetermined condition, to the mixed acid feeder 50.

In the etching trough 11, a chemical processing zone is formed in the neighborhood of the wafers 21 for etching the wafers. The chemical processing zone is sealed at the top by the superficial horizontal laminar flow 19 to permit circulation of the rotating flow 20 as a steady-state flow of the mixed acid 18. The superficial horizontal laminar flow 19 is first formed powerfully under the liquid surface in the etching trough 11 by mixed acid 18 jet from the mixed acid rectification breakthrough holes 17, and then the rotating flow 20 is induced by mixed acid 18 supplied through the mixed acid supply through hole 23 together with the superficial horizontal laminar flow.

It was confirmed that when the supply of mixed acid through the mixed acid supply breakthrough hole 23 is stopped, the rotating flow 20 is formed as the superficial horizontal laminar flow 19 from the mixed acid rectification breakthrough holes 17 strikes the upper edge of the inclined plate 16 and is re-circulated downward along the inclined plate 16, thus providing the same functions and effects.

Since the inclined plate 16 is inclined upward toward the overflow trough 12 and downward toward the wafers 21, the stagnation of mixed acid at the intersection between the inclined plate 16 and the bottom of the etching trough 11 can be reduced, thus minimizing disturbances of the rotating flow 20 by the stagnation.

As shown in FIGS. 1 and 2, the wafers 21 are disposed in a wafer basket 22 such that they are substantially vertical and parallel at an adequate interval to the rotating flow 20. The wafer basket 22 is rotated in the direction of arrow A opposite to the direction of the rotating flow 20 to increase the efficiency of contact with mixed acid. However, it is possible to rotate the wafer basket 22 in the same direction as the rotating flow.

With the above structure, the neighborhood of the wafers 21 is exposed to the field of uniform dispersion of air bubbles for bubbling 15 and steady-state rotating flow of mixed acid. The wafer surface thus can always be uniformly exposed to mixed acid in the state of steady-state flow. It is thus possible to uniformly etch to the surfaces of the wafers 21 and obtain wafers having stable luster without sacrifice in the flatness.

Functions obtainable with the above etching apparatus will be described.

Figure 4:
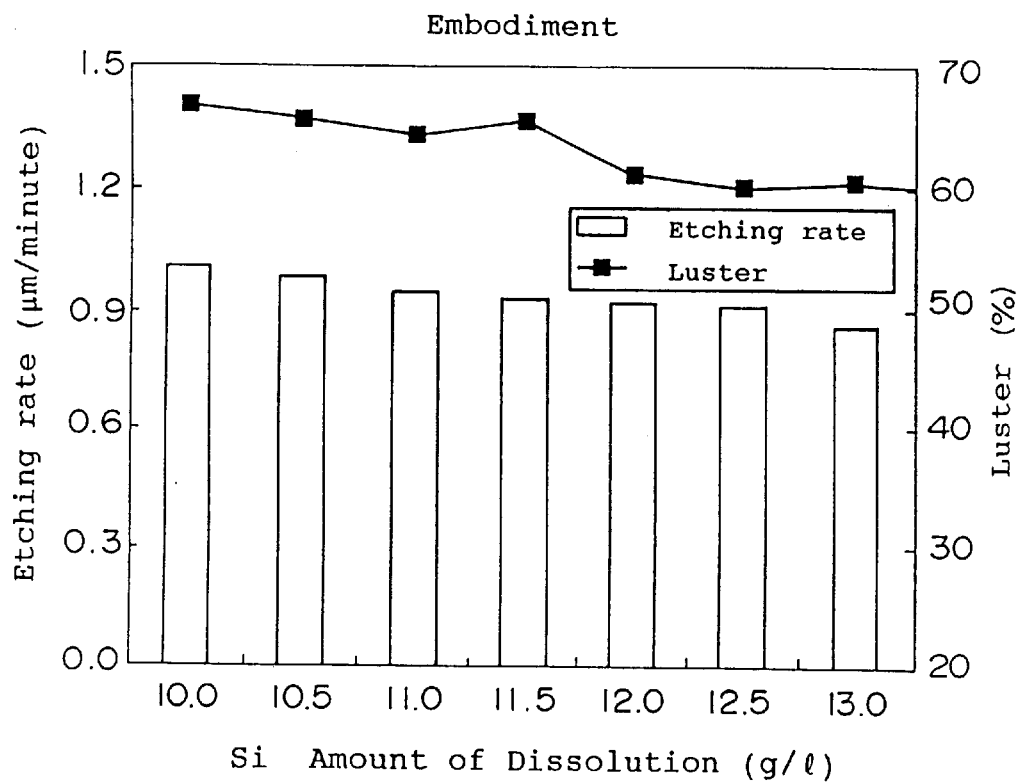
FIG. 4 is a graph showing results of etching done with the etching apparatus according to the invention.
Figure 5:
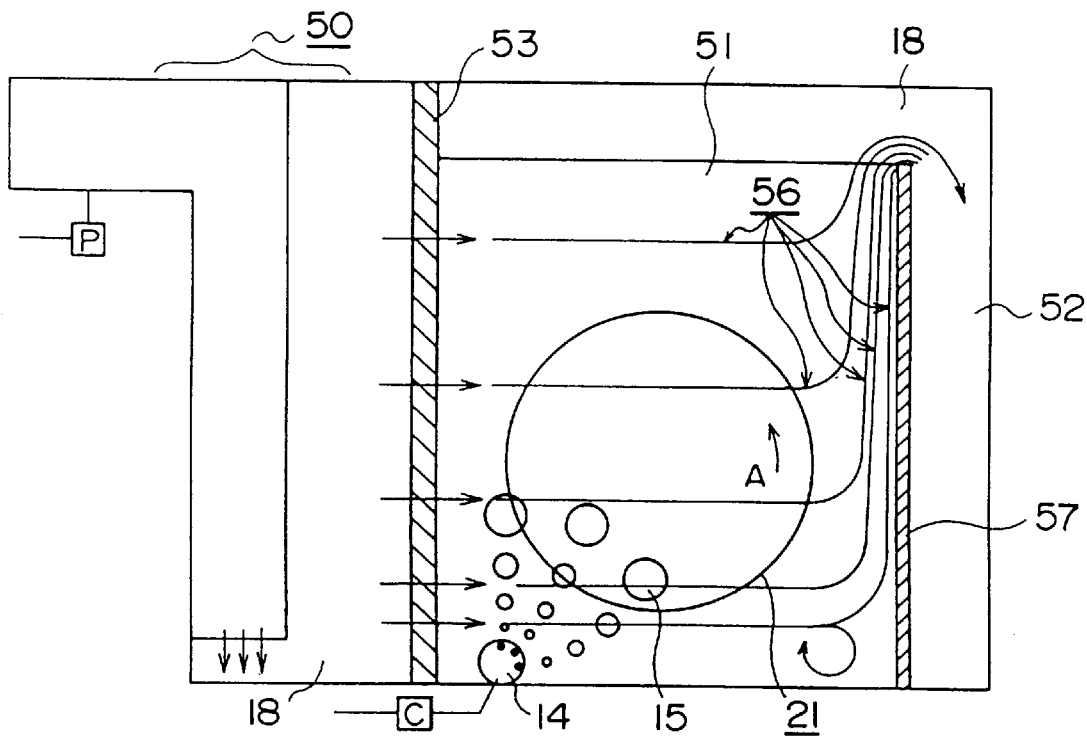
FIG. 5 is a schematic sectional view showing a prior art etching apparatus.

Using the above etching apparatus, silicon wafers having a diameter of 150 mm were etched with a mixed acid composed of 50% fluoric acid and equal volume ratios of concentrated nitric acid and concentrated acetic acid and at an etching temperature of 30° C. The mixed acid was prepared for testing by dissolving beforehand a predetermined amount of silicon in a range of 10.0 to 13.0 g/l. Etching was done by supplying the mixed acid at a rate of 250 l/minute with the pump P and also supplying bubbles at a rate of 200 l/minute with the compressor C. Results are shown in FIG. 4.

It will be seen that with the dissolved silicon content ranging from 10.0 to 13.0 g/l, the etching rate could be held within 1.02 to 0.86 $\mu$m/minute, and also the luster was stable and in a range of 67 to 60%.

While in the prior art both luster and flatness were taken into considerations when setting the etching conditions, according to the invention it is possible to readily set etching conditions by considering the flatness improvement while maintaining predetermined luster.

What is claimed is:

1. A process of etching wafers comprising the steps of disposing a row of semiconductor wafers in an etching trough supplied with an etching mixed acid such that the wafers are parallel to the flow of the mixed acid, stand vertically and apart and are capable of being rotated in one body as a row, and supplying the mixed acid to the etching trough to etch said wafers, dispersing bubbles being supplied through a lower portion of the etching trough into the mixed acid therein, the mixed acid being caused to flow together with the bubbles therein through the etching trough as a superficial horizontal laminar flow formed in the liquid level and a vertical rotating flow induced adjacent the semiconductor wafers, the mixed acid in the etching trough being caused to overflow on the side thereof opposite its supply side and thus discharged so that a steady-state flow of the mixed acid through the etching trough is maintained.

2. The wafer etching process according to claim 1, wherein the vertical rotating flow is induced adjacent the semiconductor wafers by vertical rotating flow inducing means including a mixed acid feeder for pump pressure feeding the mixed acid, said mixed acid feeder located adjacent the etching trough and beneath the center position of the wafers accommodated in the etching trough and the superficial horizontal laminar flow in the liquid level above the wafers.

3. The wafer etching process according to claim 2, wherein the vertical rotating flow is generated by vertical rotating flow generating means, said vertical rotating flow generating means being constituted by a laminar flow of mixed acid lets through round breakthrough holes or horizontal slit holes and the superficial horizontal laminar flow in the liquid level.

4. The wafer etching process according to claim 2, wherein the superficial horizontal laminar flow is generated by superficial horizontal laminar flow generating means constituted by a laminar flow of mixed acid jet through round breakthrough holes or horizontal slit holes.

5. The wafer etching process according to claim 1, wherein the superficial horizontal laminar flow is formed in the liquid level in the etching trough by superficial horizontal laminar flow generating means located adjacent the etching trough and above the center position of the wafers accommodated in the etching trough.

6. The wafer etching process according to claim 1, wherein the overflow of the mixed acid is caused by an upwardly outwardly inclined plate.

7. An apparatus for etching wafers comprising an etching mixed acid feeder, an etching trough, and an overflow trough, a row of semiconductor wafers disposed in the etching trough such that they stand vertically in an upright direction and apart, parallel to a mixed acid flow and rotated in one body as said row while being chemically processed with air bubbles dispersed in the mixed acid flow through a lower portion of the etching trough, the mixed acid feeder being constructed such that a steady-state flow of the mixed acid together with the air bubbles therein through the etching trough is produced as a superficial horizontal laminar flow formed in the surface of the liquid level and a vertical rotating flow induced adjacent the semiconductor wafers in the direction of the upright disposition of the wafers, a partitioning wall on the side of the adjacent overflow trough having a reduced level to permit smooth flow of the laminar flow into the overflow trough.

8. The etching apparatus according to claim 7, which further comprises a rectifying plate disposed between the etching trough and the mixed acid feeder, the rectifying plate having an upper portion formed with a plurality of mixed acid rectifying breakthrough holes for forming the superficial horizontal laminar flow and a lower portion formed with a mixed acid feeding through hole for inducing the vertical rotating flow in the neighborhood of the semiconductor wafers.

9. The etching apparatus according to claim 8, wherein the mixed acid rectifying breakthrough holes have a shape of a round hole or a horizontal slit.

10. The etching apparatus according to claim 7, which further comprises an upwardly outwardly inclined plate disposed on the side of the wafer disposition position opposite the rectifying plate, the vertical rotating flow being maintained by a cooperation of the superficial horizontal laminar flow and the inclined plate.

* * * * *